(12) United States Patent
Baik et al.

(10) Patent No.: US 7,772,777 B2
(45) Date of Patent: Aug. 10, 2010

(54) PLASMA DISPLAY APPARATUS

(75) Inventors: Joonsuk Baik, Yongin-si (KR); Taekyoung Kang, Yongin-si (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 680 days.

(21) Appl. No.: 11/635,023

(22) Filed: Dec. 7, 2006

(65) Prior Publication Data
US 2007/0134984 A1 Jun. 14, 2007

(30) Foreign Application Priority Data
Dec. 8, 2005 (KR) .................. 10-2005-119778

(51) Int. Cl.
*H01J 17/49* (2006.01)

(52) U.S. Cl. ...................................... 313/587; 313/583
(58) Field of Classification Search .......... 313/582–587
See application file for complete search history.

(56) References Cited

U.S. PATENT DOCUMENTS

2003/0020152 A1* 1/2003 Inoue et al. .................. 257/684
2005/0264476 A1* 12/2005 Kim et al. ...................... 345/60

FOREIGN PATENT DOCUMENTS

KR 10-2005-0044968 5/2005

* cited by examiner

*Primary Examiner*—Bumsuk Won
(74) *Attorney, Agent, or Firm*—Robert E. Bushnell, Esq.

(57) ABSTRACT

A Plasma Display Panel (PDP) reinforces a ground of a circuit board by directly connecting a protection plate, which protects a Tape Carrier Package (TCP), to the ground portion of a circuit board. Accordingly, the noise inflow into an address buffer board is reduced.

15 Claims, 4 Drawing Sheets

PLASMA DISPLAY APPARATUS

CLAIM OF PRIORITY

This application makes reference to, incorporates the same herein, and claims all benefits accruing under 35 U.S.C. §119 from an application for PLASMA DISPLAY APPARATUS earlier filed in the Korean Intellectual Property Office on the 8 of Dec. 2005 and there duly assigned Serial No. 10-2005-0119778.

BACKGROUND OF THE INVENTION

1. Field of the Invention

The present invention relates to a plasma display apparatus, and more particularly, to a plasma display apparatus, which can reinforce the ground portion of a circuit board by directly connecting a protection plate to the ground portion of a circuit board for protecting a Tape Carrier Package (TCP).

2. Description of the Related Art

Recently, an abundance of flat display devices, which replace Cathode Ray Tubes (CRTs), have been developed. These flat display devices typically include Liquid Crystal Displays (LCDs), Electro-Luminescent Displays (ELDs), Field Emission Displays (FEDs) and Plasma Display Panels (PDPs).

PDPs display an image by a plasma discharge. PDPs have an advantage in that they can realize a perfect digital image as well as a large size screen more easily than other flat display devices.

Such PDPs are composed of a filter assembly, a panel, a thermal conductive sheet, a chassis base, a circuit board, a connecting member, a protection plate and various kinds of additional devices, which are arranged inside the front/rear case.

Referring to the FIG. 1, a chassis base 15 supports a panel 12, which displays an image, at the rear of the panel, and a circuit board 16 (for example, an address buffer board) is fixed to the rear of the chassis base 15 and then transfers a driving signal to the address electrode of the panel 12. The address buffer board 16 transfers a driving signal to the panel by a connecting member, such as a Tape Carrier Package (TCP) (not shown in FIG. 1). Reference number 14 indicates a reinforcement that prevents the deflection of the chassis base. The reinforcement 14 further provides a driving chip to be mounted in the TCP with a place to be loaded.

A protection plate 18, which protects the TCP, is fixed to the chassis base 15 by a linking member 19. The protection plate 18 is in contact with the driving chip to be mounted in the TCP, either directly or with a coated connecting line of the TCP, and thus radiates heat generated by the driving chip.

Furthermore, the ground portion of the address buffer board 16 is electrically connected to the metallic chassis base 15 by a conductive linking member 17, thereby allowing the chassis base 15 to perform the ground function. Also, the protection plate 18 is electrically connected to the chassis base 15 by the linking member 19, thereby allowing the protection plate 18 to perform the ground function.

However, the address buffer board 16 needs to supply a high voltage to an address electrode inside the panel 12. Therefore, it is very important to ground the address board stably, because it affects the capability and quality of the PDP.

According, since the protection plate 18 is in contact with the ground portion of the address buffer board 16 directly and not indirectly via the chassis base 15, the ground of the address board 16 can be reinforced, thereby allowing the noise inflow into the address buffer board to be reduced.

SUMMARY OF THE INVENTION

Accordingly, an object of the present invention is to provide a plasma display apparatus, which can reinforce the ground of a circuit board by directly connecting a protection plate, which protects a Tape Carrier Package (TCP), to the ground portion of a circuit board.

In order to accomplish this object, a plasma display apparatus is provided including: a chassis base; a panel attached to a first surface of the chassis base; a circuit board, attached to a second surface of the chassis base, and configured to supply the panel with a driving signal; a connecting member, including a driving chip, and configured to transfer the driving signal from the circuit board to the panel; and a conductive protection plate, arranged on the connecting member, and configured to be in contact with a ground portion of the circuit board.

The protection plate includes at least one projecting groove at a position corresponding to the ground portion of the circuit board to be in contact therewith. The protection plate is attached to the circuit board by a linking member.

The projecting groove includes at least one connecting hole configured to receive the linking member therein.

The linking member includes at least one of screws including a bolt, a boss or a self-threading screw.

The projecting groove includes a connecting surface extending along a direction of the circuit board from a first surface of the prevention plate and a bottom surface electrically connected to the ground portion of the circuit board and arranged at an end of the connecting surface.

The chassis base includes conductive materials. The chassis base is electrically connected to the ground portion of the circuit board.

The chassis base, the ground portion of the circuit board and the protection plate are electrically connected to each other by the linking member.

The chassis base includes nonconductive materials. The nonconductive materials include a synthetic resin having excellent electrical insulation properties. The chassis base includes a conductive thin film arranged on at least one surface thereof. The conductive thin film is electrically connected to the ground portion of the circuit board.

The protection plate, the ground portion of the circuit board and the conductive thin film are electrically connected to each other by the linking member.

The driving chip directly contacts the protection plate.

Either a thermally conductive sheet or an adhesive member are arranged between the driving chip and the protection plate.

The circuit board includes an address buffer board.

BRIEF DESCRIPTION OF THE DRAWINGS

The above and other objects, features and advantages of the present invention will be more apparent from the following detailed description taken in conjunction with the accompanying drawing, in which.

DETAILED DESCRIPTION OF THE INVENTION

Figure 1:
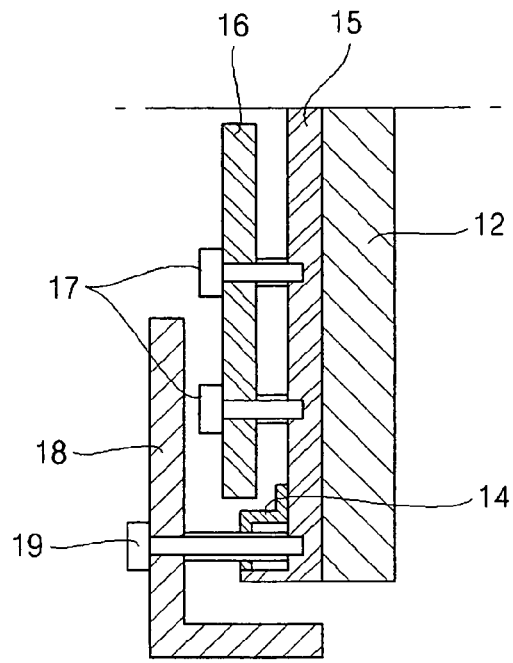
FIG. 1 is a schematic sectional diagram of a conventional protection plate arranged apart from an address buffer board.

Hereinafter, exemplary embodiments of the present invention are described in detail below with reference to the accompanying drawing. The aspects and features of the present invention and methods of achieving the aspects and features will be apparent by referring to the embodiments to be described in detail with reference to the accompanying drawings. However, the present invention is not limited to the embodiments disclosed hereinafter, but may be implemented in diverse forms. The matters defined in the description, such as the detailed construction and elements, are merely specific details provided to assist those of ordinary skill in the art in a comprehensive understanding of the present invention, and the present invention is only defined by the scope of the appended claims. In the entire description of the present invention, the same drawing reference numerals are used for the same elements across various figures.

Figure 2:
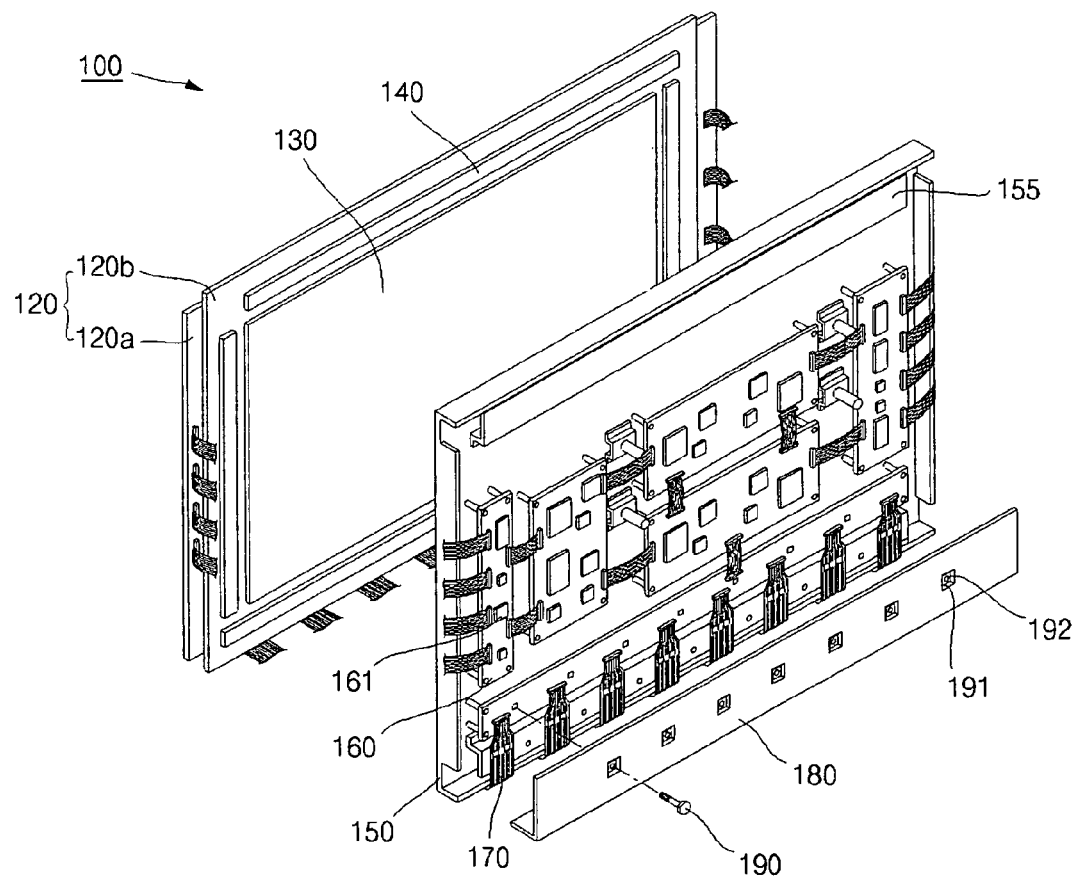
FIG. 2 is an exploded perspective view of a Plasma Display Panel (PDP) according to one exemplary embodiment of the present invention.

FIG. 2 is an exploded perspective view of a Plasma Display Panel (PDP) according to one exemplary embodiment of the present invention.

Referring to the FIG. 2, a plasma display apparatus 100 comprises a panel 120, a thermal conductive sheet 130, an adhesive member 140, a chassis base 150, a circuit board 160, a connecting member 170 and a protection plate 180.

The panel 120 displays an image by the discharge generated by a driving signal provided from a circuit element 161 that is connected to the circuit board 160. The panel 120 forms a discharge cell, where a discharge occurs, by forming a barrier, an electrode, a fluorescent body, a dielectric, and a protection shield, between two substrates 120a and 120b.

Furthermore, the discharge cell is filled with an inert gas emitting ultraviolet rays having a wavelength band that excites a fluorescent body during the discharge. Such a panel 120 is connected to the circuit board 160 by the connecting member 17, such as Chip on Film (COF) Tape Carrier Package (TCP), in which Flexible Printed Circuits (FPCs) or some driving chips are placed.

The thermal conductive sheet 130 is inserted between the panel 120 and the chassis base 150 and prevents the temperature of the panel 120 from increasing suddenly by either transferring heat generated from the panel 120 to the chassis base 150 or radiating the heat. Furthermore, the thermal conductive sheet 130 causes the temperature distribution of the panel 120 to be uniform, and thus prevents damage or an error operation of the panel 120 due to the local difference in temperature. It is desirable that adhesion methods and functions of the thermal conductive sheet 130 are differentiated according to materials of the chassis base 150 in order for the PDP to operate normally. For example, if the chassis base 150 is made with a material with a high thermal conductivity and superior heat radiation property, such as metallic materials, the thermal conductive sheet 130 adheres closely to the chassis base 150. In this case, heat generated by the panel 120 is transferred to the chassis base 150 through the thermal conductive sheet 130 and then radiated, where some portion of heat may be radiated by the thermal conductive sheet 130. On the other hand, if the chassis base 150 is made of a material with a low thermal conductivity and inferior heat radiation property, such as plastic materials, the thermal conductive sheet 130 and the chassis base 150 are spaced apart by a predetermined distance. In this case, most of the heat generated by the panel 120 is radiated by the thermal sheet 130 to maintain the panel 120 at constant temperature.

The adhesive member 140 fixes the panel 120 to the chassis base 150. Thus, the adhesive member 140, as shown in FIG. 2, is formed into a tape or frame shape at the edge of the thermal conductive sheet 130, and fixes the panel 120 to the chassis base 150. Such an adhesive member 140 uses an adhesive, an adhesive sheet, an adhesive tape or the like. However, the present invention is not limited thereto. It is desirable that adhesion methods, the thickness, shapes and materials of the adhesive member 140 are differentiated according to the features of the chassis base 150. As described above, when using the chassis base 150 made with the material with a low thermal conductivity and inferior heat radiation property, it is desirable that the adhesive members 140 are spaced apart from each other. This is make it easy to radiate heat from the heat conductive sheet 130 by ventilating air through the spaces. However, the present invention is not limited thereto. On the other hand, when using the chassis base 150 made with the material with a good thermal conductivity and heat radiation property, it is desirable to determine the shape and type of the adhesive member 140 so that the thermal conductive sheet 130 and the chassis base 150 adhere closely to each other.

The chassis base 150 fixes the panel 120 to the adhesive member 140, and also supports and fixes the circuit board 160 to additional members including a boss or a screw. The chassis base 150 supports the panel 120, and simultaneously radiates heat generated by the panel 120 and the circuit board 160. Furthermore, the chassis base 160 is used as the power supply ground. For this purpose, the chassis base 160 is made of aluminum, aluminum alloys and the like. Since the PDP has been slimmed down recently, the thickness of the chassis base 150 is also required to be thinner. However, if the thickness of the chassis base 150 becomes thinner, the supporting function for the panel 120 will be weaker. Therefore, a reinforcement 155 is arranged at the rear of the chassis base 150, that is, the surface opposite to a surface, where the panel 120 is adhered, to prevent the deflection of the chassis base 150 and consequently reinforce the strength thereof. Since design methods of a circuit and a panel have been developed recently, the power consumption of the PDP has been reduced and electromagnetic interference and heat generation have also been decreased. Accordingly, it is desirable to replace 11 the expensive chassis base 150 made of aluminum with a cheaper chassis base made of plastic. Features of the chassis base made of plastic are easy molding, process simplification, weight reduction of the PDP and a good sound absorption property, in addition to the cost reduction of materials.

The circuit board 160 is composed of several separate pieces of substrates to drive the PDP. In particular, the circuit board 160 comprises a power supply unit, a logic control unit, an address driving unit, a scan driving unit, a sustain driving unit, a driving buffer board or an image processing unit. Of course, one or more driving unit is formed on the one circuit board 160 or one driving unit may be formed by dividing two or more circuit boards 160. However, the present invention is not limited thereto.

The power supply unit supplies power to the driving circuit of the circuit board 160 and the panel 120, and an Alternating-Current (AC) to Direct-Current (DC) converter that converts AC to DC is included therein. The logic control unit receives an image signal, divides the image signal to be sent to the address driving unit, the scan driving unit and the sustain driving unit, and controls each driving unit and the electric power supplied by the power supply unit. Each driving unit transfers the signal received from the logic control unit to each circuit element 161, and each circuit element 161 distributes the signals to each electrode. The driving buffer boards are arranged between the driving unit and the panel 120. The driving signals are supplied from each of the driving units to the panel via the driving buffer board. The driving buffer boards may include an address buffer board that is arranged along one side of the chassis base 150 and a scan buffer board that is arranged along another side of the chassis base 150. However, the present invention is not limited thereto. Additionally, these driving buffer boards are connected to the panel 120 using TCP, FPC, FFC or other connecting members 170.

The protection plate 180 protects the connecting member 170 from impacts and impurities and reinforces the chassis base 150. Furthermore, the protection plate 180 radiates heat generated from the connecting member 170 along with transferring it to the chassis base 150 in order to prevent damage and errors in operation. Additionally, the protection plate 180 is provided with at least one projecting groove 191. The projecting groove 191 is provided with at least one connecting hole 192 so that the chassis base 150 is connected to the protection plate 180 using a linking member 190 that penetrates the connecting hole 192. Thus, the connecting hole 192 is formed into a shape corresponding to the sectional shape of the linking member 190, and if the linking member 190 is provided with a mating unit, such as a spiral groove of a bolt thread, the connecting hole 192 may be also formed into the shape corresponding to the mating unit. The linking member 190, which penetrates the protection plate 180 through the connecting hole 192, penetrates the circuit board 160 placed between the protection plate 180 and the chassis base 150, and then is attached to the chassis base 150. Therefore, the protection plate 180 is connected to the chassis base 150 by the linking member 190 that penetrates the connecting hole 192 and the circuit board 160. Additionally, the projecting groove 191 allows the protection plate 180 to contact the circuit board 160 electrically and mechanically. In particular, the projecting groove 191 is projected toward the circuit board 160 rather than the surface of the protection plate 180 and a flat bottom surface is formed on the projection surface, so that the protection plate 180 is connected to the ground portion of the circuit board 160. The protection plate 180 is described below in detail with reference to FIGS. 3 and 4.

Figure 3:
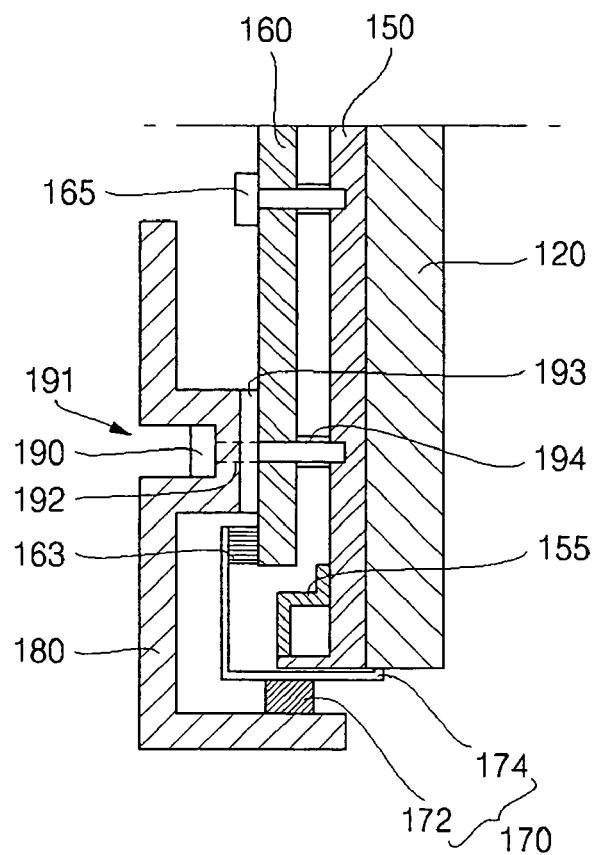
FIG. 3 is a sectional diagram of a portion of a protection plate in contact with the ground portion of an address buffer board according to the exemplary embodiment of the present invention.

FIG. 3 is a sectional diagram of a portion of the protection plate in contact with the ground portion of an address buffer board according to one embodiment of the present invention.

Referring to FIG. 3, the chassis base 150 supports the panel 120 at the rear of the panel 120, and the circuit board 160 adheres to the surface opposite to the surface to which the panel 120 is adhered. Even though the chassis base 150 adheres to the panel 120 directly, an adhesive member or a thermal conductive sheet may be inserted. However, the present invention is not limited thereto. FIG. 3 shows a TCP, in which a driving chip 172 is placed, as an example of the connecting member 170, when the panel 120 is connected to the circuit board 160 by the connecting member 170. The TCP connecting member 170 is arranged between the address buffer board among the circuit boards and the panel 120, and supplies an address signal. The TCP connecting member 170 is composed of a connection line 174, which is coated with an electrical insulator and in which the driving chip 172 is arranged. One end of the TCP connecting member 170 is connected to a connector 163 formed on the circuit board 160, and the other end of the TCP connecting member 170 is connected to the address electrode of the panel 120. More particularly, the TCP 170 is physically in contact with the protection plate 180. Considering the characteristics of the plasma display apparatus, each driving unit including the address driving unit uses high voltage as a signal, and thus the driving chips 172 thereof create a higher level of heat generation than other displays. Furthermore, since each driving chip 172 must feature a voltage withstanding capacity, expensive chips are used. This is a reason that heat radiation thereof is connected closely to signal falsification and signal transfer characteristics. Accordingly, the protection plate 180 is in contact with the driving chip 172, thereby allowing the protection plate 180 to radiate heat generated by the driving chip 172.

As described above, the protection plate 180 is provided with a plurality of projecting grooves 191. The structure of the projecting grooves 191 is explained in detail below with reference to FIGS. 4, 5 and 6 and the adhesion between the circuit board 160 and the projecting groove 191 is explained below with reference to FIG. 3. As shown in FIG. 3, the projecting groove 191 projects from the protection plate 180 toward the circuit board 160. One side of the projecting groove 191 is arranged close to the circuit board 160. The connection hole 192 is formed into a shape corresponding to the linking member 190 on the projecting groove 191. As described above, the linking member 190 connects the chassis base 150 to the protection plate 180 through the connection hole 192. Therefore, a penetrating hole 194 is formed into a shape similar to the connection hole 192 on the circuit board 160 and allows the linking member 190 to be attached to the chassis base 150.

In addition, according to the present invention, the protection plate 180 is used as the power supply ground of the circuit board 160. Therefore, the protection plate 180 is electrically connected to the ground portion 193 formed on the circuit board 160. As shown in FIG. 3, in the ground portion 193, a portion of circuit patterns are formed into a shape corresponding to the projecting groove 191 on the circuit board 160. The ground portion 193 does not need to use the same material as that of the circuit patterns formed on the circuit board 160, and all materials, which can be electrically connected to the circuit pattern, can be used.

Additionally, the reinforcement 155 can be further attached to the chassis base 150. The reinforcement 155 is attached to the chassis base 150 in order to reinforce the strength of the chassis base 150.

The linking member 190, which links the protection plate 180 to the chassis base 150, may use conductive materials. The linking member 190 uses the combination of a boss and a bolt or a screw. However, the present invention is not limited thereto. The screw may include a self-tapping screw, composed of a head and a screw thread of which the sectional surface of one end is a triangle shape. The screw is fastened by creating its own mating thread and thus, an additional tapping process for forming a female thread is not necessary. The present invention is not limited to the linking member 190, and may use an adhesive member or other fixing units.

The protection plate 180 is in contact with the driving chip 172, which is placed in the TCP, either directly or with a coated connecting line that composes the TCP, so that heat generated from the driving chip 172 is radiated.

Figure 4:
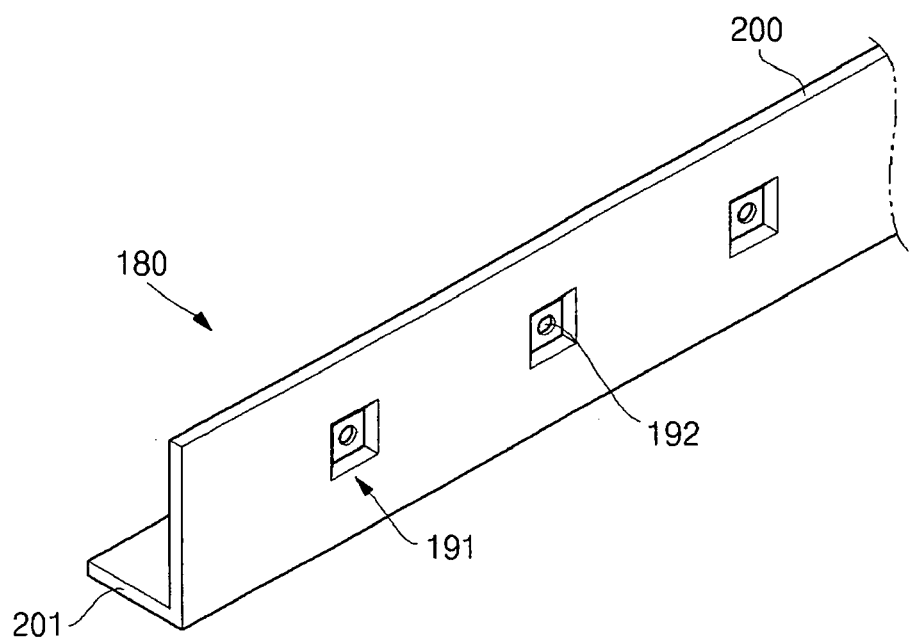
FIG. 4 is a perspective view of the protection plate of a PDP according to one embodiment of the present invention.
Figure 5:
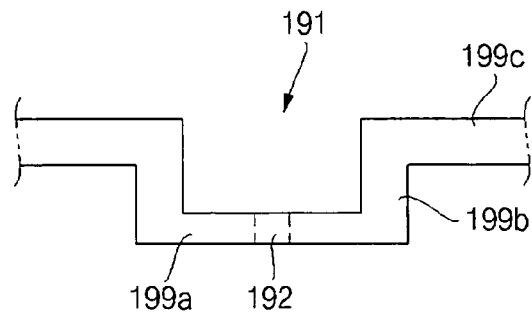
FIG. 5 is a sectional view of a projecting groove.
Figure 6:
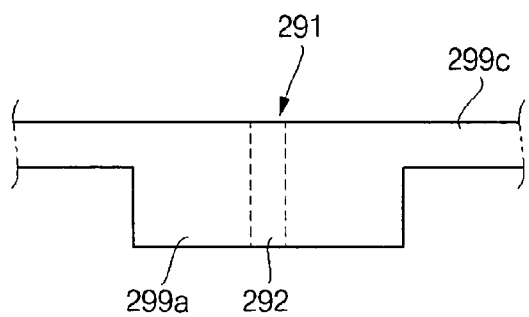
FIG. 6 is a sectional diagram of another projecting groove.

FIGS. 4, 5 and 6 are views of the protection plate and the projecting groove. In particular, FIG. 4 is a perspective view of the protection plate, FIG. 5 is a sectional view of the projecting groove, and FIG. 6 is a sectional diagram of another projecting groove.

Referring to FIG. 4, the protection plate 180 is configured to form at least two surfaces, a first surface 200 that is parallel with the chassis base 160 and a second surface that is bent away from the first surface. Although a protection plate 180 having only the first surface 200 can be used as the power supply ground, it is desirable for the protection plate 180 to have the first surface 200 as well as the second surface 201 for the heat radiation from and protection of the TCP type connecting member 170.

The first surface 200 is provided with a plurality of the projecting grooves 191 and the connection hole 192 is formed on one side of the projecting groove. The projecting groove 191 is configured to have a step difference between the first surface 200 and the surface where the circuit board 160 is placed, by press molding. However, the present invention is not limited thereto.

As illustrated in FIG. 4, although the projecting groove 191 has a square shape, an oval, triangular or polygonal shape is allowable.

As shown in FIG. 5, the projecting groove 191 is composed of a flat bottom surface 199a and a connecting surface 199b which connects the protection plate surface 199c to the bottom surface 199a, in order to allow the projecting groove to be in contact with the ground portion of the circuit board 160. Furthermore, the bottom surface 199a is provided with the connecting hole 192. If the shape of the projecting groove 191 is that shown in FIG. 5, manufacturing processes will be simplified and the manufacturing cost will be reduced as well. The protection plate 180, as shown in FIG. 5, is formed by injection molding a metallic material into a vent shape to form the first surface 200 and the second surface 201, then followed by pressurizing and punching to form the projecting groove 191. Also, the protection plate 180 can be formed by injection molding a metallic material to form the first surface 200, bending the first surface 200 by pressurizing to form the second surface 201, then forming the projecting groove 191. However, the present invention is not limited thereto. When using a space, which is formed between the bottom surface 199a and the plate surface 199c by the connecting surface 199b, and filled with metallic materials, the injection molding method needs to entail additional complicated processes and consequently increases the manufacturing cost. Therefore, it is desirable to select a form of the projecting groove 191 and the process according to PDP features and manufacturing costs.

FIG. 6 is a sectional diagram of another projecting groove.

Referring to FIG. 6, the projecting groove 292 comprises the bottom surface 299a without a cavity that may be formed by the bottom surface 299a. Furthermore, the connecting hole 292 in FIG. 6 is longer than that of FIG. 5. Differently from FIG. 5, since the projection groove 292 is formed without the cavity, one end of the connecting member 190 projects higher than the protection plate 180.

Figure 7:
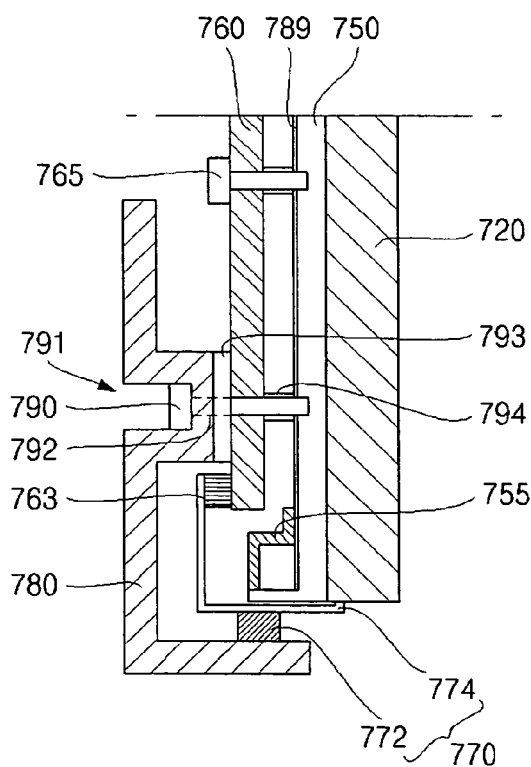
FIG. 7 is a sectional view of one example of a protection plate using an electrically insulating synthetic resin.

FIG. 7 is a sectional view of one example of a protection plate using an electrically insulating synthetic resin. In FIG. 7, elements which are the same as those of FIG. 3 have been omitted.

Referring to FIG. 7, the chassis base 750 is made either with conductive materials, such as aluminum, or with non-conductive materials, such as plastic. When made with non-conductive materials, for example, an electrically insulating synthetic resin, the chassis base 750 may include either a conductive thin foil or a conductive thin film on at least one side thereof in order to function as the power supply ground.

Additionally, the ground portion 793 of the circuit board 760 is electrically connected to the conductive thin film (or the conductive thin foil, 789) formed on at least one side of the chassis base 750. In this case, the conductive linking member 790 is used to connect the protection plate 780 to the circuit board 760 and the chassis base 750. As shown in FIG. 7, the thin film 789 is formed on the surface where the circuit board 760 is placed. The conductive thin film 789 may be also formed on another surface of the chassis base 750 where the panel 720 is arranged.

According to the present invention, the protection plate 780 is in contact with the ground portion 793 of the circuit board 760 directly and not indirectly via the chassis base 750, so that the ground of the circuit board 760 can be reinforced and the noise inflow into the circuit board 760 can be reduced.

Figure 8:
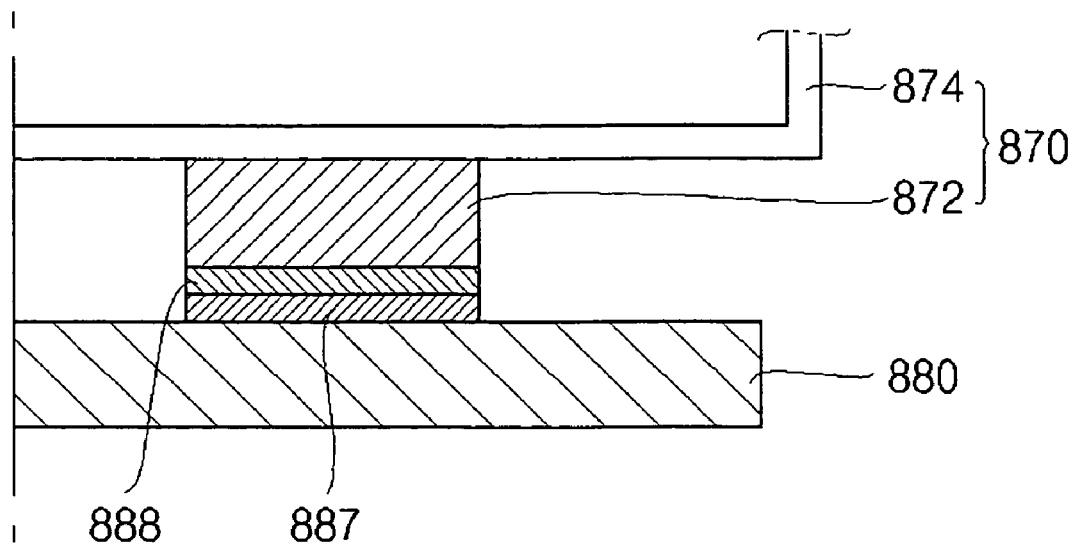
FIG. 8 is another example of a method of joining a Tape Carrier Package (TCP) linking member to the protection plate.

FIG. 8 is another example of a method of joining a TCP linking member to the protection plate.

Referring to FIG. 8, the TCP type connecting member 870 is in contact with the protection plate 880 either directly or indirectly using mediators. As shown in FIGS. 3 and 7, the driving chips 172 and 772 of the TCP type connecting members 170 and 770 are respectively in contact with the protection plates 180 and 780. However, in this case, it is difficult to closely attach the driving chips 172 and 772 to the protection plates 180 and 780, and the impact on the protection plates 180 and 780 is transferred to the driving chips 172 and 772. Therefore, the heat transfer from the driving chips 172 and 772 to the protection plates 180 and 780 does not progress smoothly, and the impact on the protection plates 180 and 780 may cause the driving chips 172 and 772 to be damaged.

Accordingly, as shown in FIG. 8, the thermal conductive sheet 888 and the adhesive member 887 are inserted between the TCP type connecting member 870 and the protection plate 880 to secure stability of the driving chip 872. The thermal conductive sheet 888 is formed on the driving chip 872, and fixed to the protection plate 880 by the adhesive member 887. It is desirable to use an adhesive member 887 which is as thin as possible and has a high thermal conductivity. Furthermore, it is desirable that at least one of the adhesive member 887 and thermal sheet 888 is made of materials having excellent elasticity in order to facilitate impact absorption. However, the present invention is not limited thereto.

The adhesive member 887 is interposed not only between the protection plate 872 and the thermal sheet 888 but also between the driving chip 872 and the thermal sheet 888. Furthermore, the adhesive member 887 is interposed only between the driving chip 872 and the thermal sheet 888.

As described above, the Plasma Display Panel (PDP), according to the present invention, produces the following effect.

The ground of the circuit board can be reinforced by connecting the protection plate, which protects the Tape Carrier Package (TCP), to the ground portion of the circuit board directly.

Accordingly, the noise inflow into the address buffer board can be reduced.

It should be understood by those of ordinary skill in the art that various replacements, modifications and changes in the form and details may be made therein without departing from the spirit and scope of the present invention as defined by the following claims. Therefore, it is to be appreciated that the above described embodiments are for purposes of illustration only and are not to be construed as limitations of the present invention.

What is claimed is:

1. A plasma display apparatus, comprising:
a chassis base;
a panel attached to a first surface of the chassis base;
a circuit board, attached to a second surface of the chassis base, and configured to supply the panel with a driving signal;
a connecting member, including a driving chip, and configured to transfer the driving signal from the circuit board to the panel; and
a conductive protection plate, arranged on the connecting member, the conductive protection plate, comprising:
 a first surface of the conductive protection plate having a projecting groove extending from the first surface of the conductive protection plate, the projecting groove having a bottom surface parallel to and in a different plane from the first surface of the conductive protection plate, the bottom surface in contact with a ground portion of the circuit board; and
 a second surface of the conductive protection plate formed at a bent angle to the first surface of the conductive protection plate and connected to the driving chip.

2. The apparatus of claim 1, wherein the protection plate is attached to the circuit board by a linking member.

3. The apparatus of claim 2, wherein the projecting groove comprises at least one connecting hole configured to receive the linking member therein.

4. The apparatus of claim 2, wherein the linking member comprises at least one of screws including a bolt, a boss or a self-threading screw.

5. The apparatus of claim 2, wherein the chassis base comprises conductive materials.

6. The apparatus of claim 5, wherein the chassis base is electrically connected to the ground portion of the circuit board.

7. The apparatus of claim 6, wherein the chassis base, the ground portion of the circuit board and the protection plate are electrically connected to each other by the linking member.

8. The apparatus of claim 2, wherein the chassis base comprises nonconductive materials.

9. The apparatus of claim 8, wherein the nonconductive materials comprise a synthetic resin having excellent electrical insulation properties.

10. The apparatus of claim 8, wherein the chassis base comprises a conductive thin film arranged on at least one surface thereof.

11. The apparatus of claim 10, wherein the conductive thin film is electrically connected to the ground portion of the circuit board.

12. The apparatus of claim 10, wherein the protection plate, the ground portion of the circuit board and the conductive thin film are electrically connected to each other by the linking member.

13. The apparatus of claim 1, wherein the driving chip directly contacts the protection plate.

14. The apparatus of claim 1, wherein either a thermally conductive sheet or an adhesive member are arranged between the driving chip and the protection plate.

15. The apparatus of claim 1, wherein the circuit board comprises an address buffer board.

* * * * *